United States Patent [19]
Lee

[11] Patent Number: 5,913,117
[45] Date of Patent: Jun. 15, 1999

[54] METHOD FOR MANUFACTURING FERROELECTRIC CAPACITOR

[75] Inventor: Wan-in Lee, Kwacheon-city, Rep. of Korea

[73] Assignee: Samsung Electronics Co., Ltd., Kyungki-do, Rep. of Korea

[21] Appl. No.: 08/618,370

[22] Filed: Mar. 19, 1996

[30] Foreign Application Priority Data

Mar. 20, 1995 [KR] Rep. of Korea .................. 95-5785

[51] Int. Cl.$^6$ ............................................. H01L 21/8242
[52] U.S. Cl. .............................. 438/240; 438/3; 438/396
[58] Field of Search ............................ 438/3, 240, 396, 438/255; 257/295

[56] References Cited

U.S. PATENT DOCUMENTS

| | | | |
|---|---|---|---|
| 4,437,139 | 3/1984 | Howard | 361/313 |
| 5,028,455 | 7/1991 | Miller et al. | 427/126.3 |
| 5,142,437 | 8/1992 | Kammerdiner et al. | 361/321.1 |
| 5,164,808 | 11/1992 | Evans, Jr. et al. | 361/305 |
| 5,185,689 | 2/1993 | Maniar | 361/313 |
| 5,192,871 | 3/1993 | Ramakrishnan et al. | 257/595 |
| 5,258,093 | 11/1993 | Maniar | 438/3 |
| 5,471,363 | 11/1995 | Mihara | 361/305 |
| 5,471,364 | 11/1995 | Summerfelt et al. | 361/321.4 |
| 5,572,052 | 11/1996 | Kashihara et al. | 257/295 |
| 5,589,284 | 12/1996 | Summerfelt et al. | 428/697 |
| 5,719,417 | 2/1998 | Roeder et al. | 257/295 |

OTHER PUBLICATIONS

H.N. Al–Shareef et al. "Characterization of Sol–Gel Pb($Zr_x Ti_{1-x}$)$O_3$ Thin Film Capacitors with Hybrid (Pt, $RuO_2$) Electrodes" *Proceedings of the NATO Advanced Research Workshop Science and Technology of Electroceramic Thin Films*, Villa del Mare, Italy, Jun. 20–24, 1994, pp. 133–146.

W. Lee, et al., "Preparation and electrical properties of high quality PZT thin films on $RuO_x$ electrode" *Integrated Ferroelectrics*, vol. 10, pp. 145–154, 1995.

*Primary Examiner*—Peter Toby Brown
*Assistant Examiner*—Toniae M. Thomas
*Attorney, Agent, or Firm*—Rothwell, Figg, Ernst & Kurz

[57] ABSTRACT

This invention is related to the manufacturing method of ferroelectric capacitor, which can be applied to the memory cell of FRAM (Ferroelectric Random Access Memory). Fabrication of ferroelectric capacitor comprising the steps of: coating a first PZT sol-gel solution on a $RuO_x$ electrode to form a first PZT layer; baking the first PZT layer; annealing the first PZT layer to produce a seed layer with a perovskite structure; coating a second PZT sol-gel solution on the seed layer to form a second PZT layer; baking the second PZT layer; and annealing the second PZT layer to form a PZT film with a perovskite structure. The ferroelectric capacitor not only has a lower leakage current level and a higher degree of remanent polarization than the conventional capacitor, but also has almost the same leakage current level as an existing Pt/PZT/Pt capacitor.

25 Claims, 3 Drawing Sheets

METHOD FOR MANUFACTURING FERROELECTRIC CAPACITOR

BACKGROUND OF THE INVENTION

The present invention relates to a method for manufacturing a ferroelectric capacitor, and more particularly, to a method for manufacturing a ferroelectric capacitor to be used as a memory cell of a ferroelectric random access memory (FRAM).

Lead zirconium titanate (PZT; $PbZr_{1-x}Ti_xO_3$) frequently used as a ferroelectric material has a considerably large polarization value and excellent electrical and material properties, though it has the disadvantage of poor durability. In a capacitor, fatigue is the phenomenon whereby the remanent polarization value is decreased by repeated switching and deterioration of ferroelectric polarization properties, exhibited in the deformation of the hysteresis loop of the capacitor, occurs.

In order to use a capacitor as a memory element, durability against switching test which is repeated to about $10^{12}$ times is required. However, in the case of a PZT-series capacitor using platinum (Pt) as an electrode, the fatigue phenomenon becomes increasingly serious after $10^6$ cycles and the ferroelectric properties are lost completely after $10^9$ cycles, and the function as a ferroelectric capacitor is last. A PZT-series ferroelectric capacitor using a ruthenium oxide ($RuO_X$) electrode can be used for an extended period because of its excellent fatigue properties. In the case of a capacitor using $RuO_X$ electrodes, the PZT film is formed on the $RuO_X$ electrode by the sol-gel method. However, the sol-gel method has the problem of maintaining a uniform thickness of the PZT film. Also, the pure perovskite structure for the PZT film cannot be obtained, and therefore, it is substantially difficult to manufacture a practical ferroelectric capacitor with low leakage current. In the case of the capacitor using Pt electrodes, the PZT film is formed and then heat-treated, thereby producing the PZT film with a uniform thickness and a pure perovskite structure. Although the capacitor using the $RuO_X$ electrode adopts the same process as the capacitor using the Pt electrode, not only is it difficult to form a film of uniform thickness, but also a considerable amount of secondary pyrochlore structures appear. When the surface of the PZT film is examined with an optical microscope, a rosette structure of round spots with a radius of about 0.1~5 $\mu$m are observed. It is considered that the rosette structures can be observed when not enough of perovskite nuclei are formed. Pb, a constituent element of PZT diffuses into the $RuO_X$ layer from the PZT film formed on the $RuO_X$ layer, which makes it difficult to form perovskite nuclei. In order to obtain a PZT film, the PZT film formed by spin-coating should be heat-treated for about 30 minutes in an oxygen atmosphere and at a temperature range from 600° C.~700° C. or heated at a temperature of about 700° C.~850° C. by a rapid thermal annealing (RTA) method. It is considered that the heat treatment process makes Pb in the PZT diffuse into the $RuO_X$ layer, thereby forming the rosette structure. Results of observing the rosette structure show that the rosette structure itself consists of pure perovskite structure. The boundary between the rosette structures is the mixture of pyrochlore and perovskite structures, and the charge accumulated in the capacitor may leak through such boundary surface. A capacitor with the $RuO_X/PZT/RuO_X$ layered structure has a leakage current value of more than $10^{-5}$ $\mu A/cm^2$ which is more than ten times that of a capacitor with a Pt/PZT/Pt layered structure. Also, it is difficult to perform the etching process and forming a multilayered film due to the roughness of the PZT film's surface.

SUMMARY OF THE INVENTION

The object of the present invention is to provide a method for manufacturing a ferroelectric capacitor which employs a ferroelectric film, which resists the formation of the rosette structure, having a uniform thickness and thus forming a pure perovskite structure.

Another object of the present invention is to provide a method for manufacturing a ferroelectric capacitor which has excellent fatigue properties and a low leakage current.

To achieve the above objects, there is provided a method for manufacturing the ferroelectric capacitor according to the present invention comprising the steps of: (a) coating a sol-gel solution of a first ferroelectric material on a first conductive oxide layer to form a first ferroelectric layer; (b) baking the first ferroelectric layer; (c) annealing the first ferroelectric layer to form a seed layer with a perovskite structure; (d) coating a sol-gel solution of a second ferroelectric material on the seed layer to form a second ferroelectric layer; (e) baking the second ferroelectric layer; and (f) annealing the second ferroelectric layer to form a ferroelectric film with a perovskite structure.

Also, to achieve the above objects, there is provided a method for manufacturing a ferroelectric capacitor according to the present invention comprising the steps of: (a) coating a sol-gel solution of a first ferroelectric material on an $RuO_X$ layer to form a first ferroelectric layer; (b) baking the first ferroelectric layer; (c) annealing the first ferroelectric layer to form a seed layer with a perovskite structure; (d) coating a sol-gel solution of a second ferroelectric material on the seed layer to form a second ferroelectric layer; (e) baking the second ferroelectric layer; and (f) annealing the second ferroelectric layer to form a ferroelectric film with a perovskite structure.

Referring to the manufacturing method of the present invention, the thickness of the seed layer is preferably as thin as possible, in the range of 10 nm~100 nm. In order to form the ferroelectric film (for example, PZT film) with a desired thickness, the step for coating the PZT sol-gel solution and then baking the second ferroelectric layer should be repeated.

In the steps for annealing the seed layer and the PZT film, they are heated instantaneously at a high temperature using the RTA process, thereby producing a pure perovskite structure of the seed layer and PZT film.

According to the present invention, the seed layer with a perovskite structure is provided on the surface of one conductive oxide layer selected from $IrO_X$, $RhO_X$, $RuO_X$ and $TiO_X$ layers, and help the growth of perovskite structure during the following formation of the PZT film. Also, the surface of ferroelectric film, that is, of the PZT film becomes flattened.

When a dopant is added to the PZT sol-gel solution, formation of the desired perovskite structure is facilitated. The dopant is at least one selected from the group consisting of Nb, Ta and La.

The present invention is characterized in that the seed layer with a perovskite structure is provided before the step of forming the PZT film, thereby producing the PZT film with a perovskite structure quickly and more easily.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

A silicon (Si) wafer or Si wafer with a silicon oxide ($SiO_2$) layer having a thickness of 300 nm is used as a substrate for the capacitor of the present invention.

Figure 1:
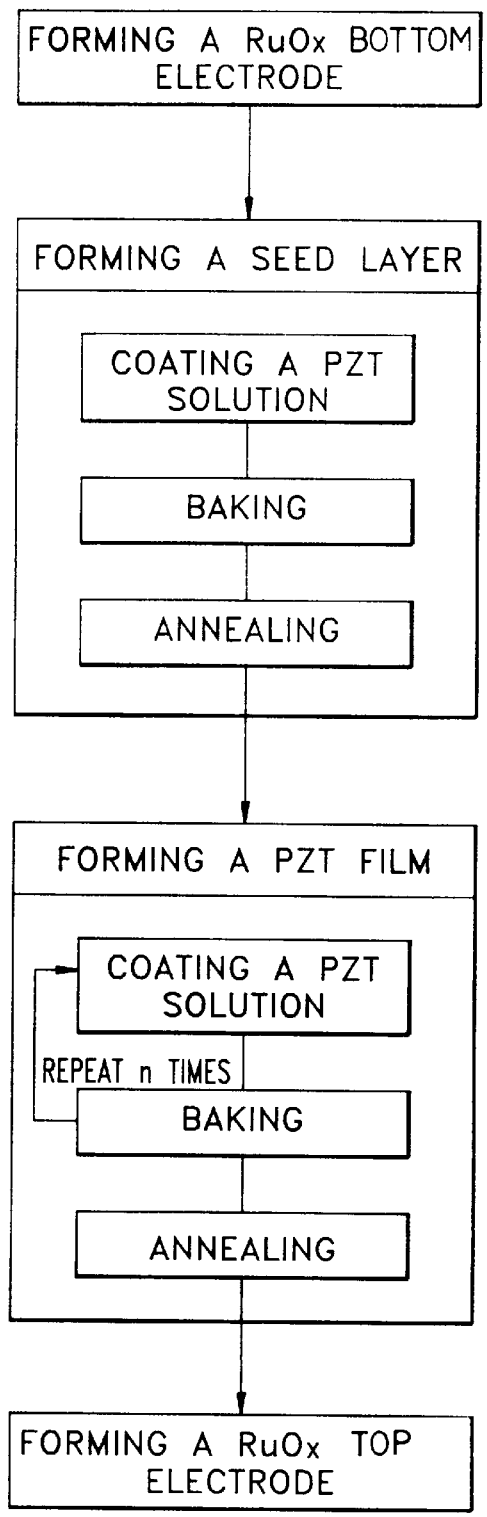
FIG. 1 is a flow chart of the manufacturing method according to the present invention.

Referring to FIG. 1, the manufacturing method of the present invention includes the steps of forming a $RuO_X$ bottom electrode, forming a seed layer on the $RuO_X$ bottom electrode, forming a ferroelectric film (for example, PZT film) on the seed layer, and forming a $RuO_X$ top electrode on the PZT film. The steps described above will be explained in detail hereinafter.

Figure 2:
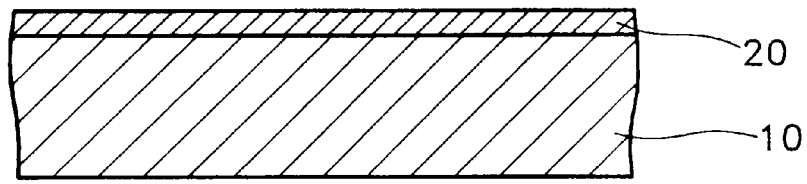
FIGS. 2 through 6 are diagrams sequentially showing each step of the manufacturing method according to the present invention.
Figure 3:
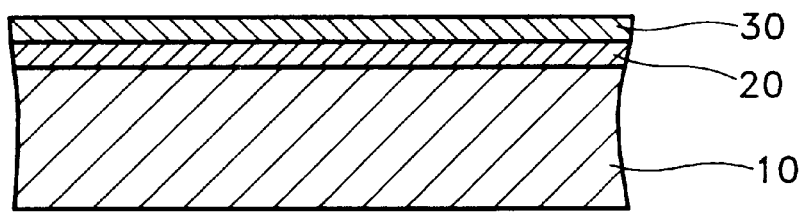

Referring to FIGS. 2 and 3, a conductive oxide layer 30 selected from $IrO_X$, $RhO_X$, $RuO_X$ and $TiO_X$, preferably $RuO_X$, with a thickness of 300 nm is deposited on an insulating layer 20 of a substrate 10 by the reactive sputtering method. The conditions for the reactive sputtering include a partial argon and oxygen atmosphere (gas ratio; 70:30) at a pressure of 200~500 mTorr and a power setting of 200~600 W. After completing the sputtering, the $RuO_X$ layer is heat-treated for about 1 hour under atmospheric conditions at a temperature of about 600° C. to provide a conductive oxide layer (bottom electrode) 30.

Figure 4:
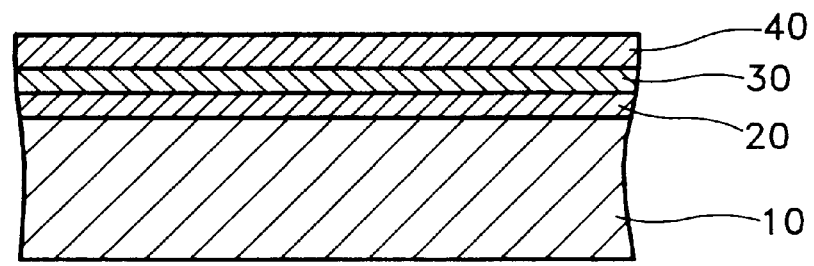

Referring to the step of forming a seed layer 40 on the $RuO_X$ layer as shown in FIG. 4, first, the first PZT sol-gel solution is diluted with n-propanol/acetic acid (1:1) to make the molar concentration of the solution to 0.05~0.3M. Such prepared first PZT sol-gel solution is coated on the $RuO_X$ bottom electrode by using a spin-coater to form a first PZT film. Here, the spin speed of the spin-coater is 2,000~5,000 rpm, and the spin time is about 40 seconds. Thereafter, such formed first PZT film is baked for five minutes at a temperature of 250° C., and then heat-treated under an oxygen atmosphere by using a diffusion furnace or RTA apparatus to obtain a seed layer 40 as shown in FIG. 4. Seed layer 40 has a thickness of about 10~70 nm. Using the RTA method, it is preferable to use a ramping speed of 10~200° C./sec, a heating temperature of 650~850° C. and a duration time for the heat treatment of 20~200 seconds.

Figure 5:
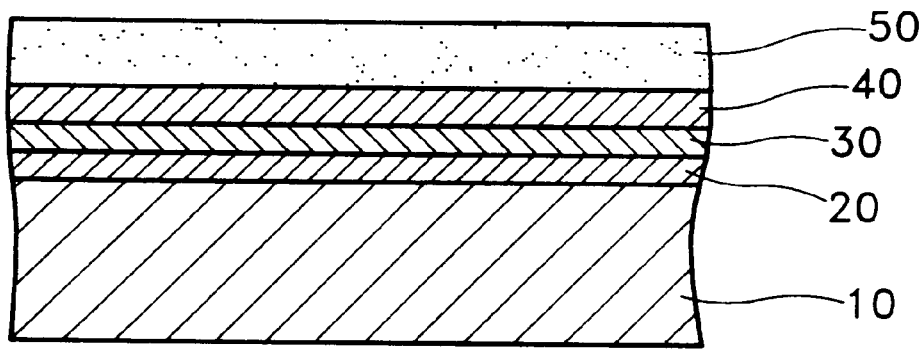

After obtaining the seed layer, the steps for coating the prepared PZT or doped PZT precursor solution onto the seed layer 40 are performed. A second PZT sol-gel solution having a concentration of 0.4M is applied on the seed layer 40 to a second PZT layer and then baked. The same coating and baking steps is repeated several times (for example, three times), thereby obtaining a PZT film 50 of the desired thickness as shown in FIG. 5. The obtained PZT film is annealed for 30 minutes under an oxygen atmosphere at a temperature of 600~700° C., or is annealed for 30 seconds at a heating temperature of 650~850° C. and a ramping speed of 10~200° C./sec using RTA apparatus. On examining the obtained thin PZT film using an SEM (scanning electron microscopy) and an X-ray diffractometer (XRD) method, it was confirmed that the thickness of the PZT film was about 300 nm and the pure perovskite structure was produced. The first and second PZT sol-gel solutions contain the dopant at the ratio of 0.5~7 mol %. The dopants expedite the formation of perovskite structure at the time of annealing. The dopant is at least one selected from Nb, Ta and La. The ferroelectric material such as $Pb(NbZr)TiO_X$, $Pb(TaZr)$ $TiO_X$ or $Pb(LaZr)TiO_X$ can be obtained depending on the kind of the dopant. In this step, the seed layer functions as a diffusion barrier preventing for Ru component of said RuOx layer and Pb component of said PZT film to diffuse respectively into said PZT film and RuOx layer, and also a perovskite phase-inducing layer to said PZT film.

Figure 6:
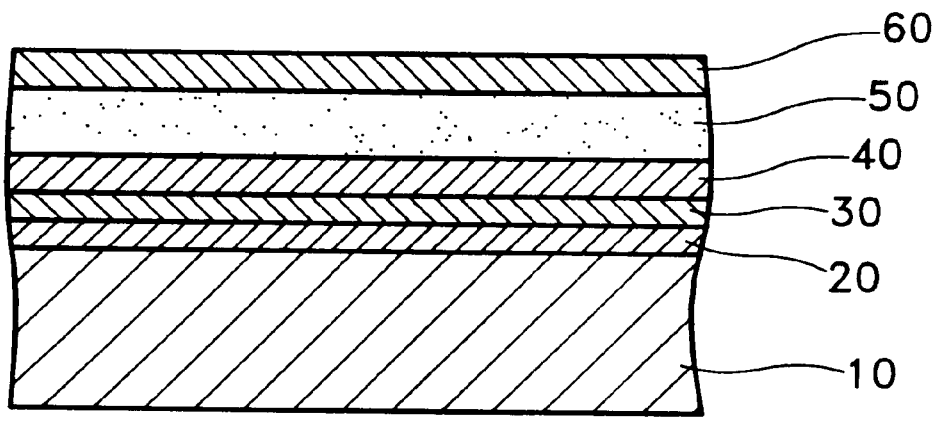

Finally, by using a shadow mask with a diameter of 75 μm, $RuO_X$ is deposited on the PZT film to provide the $RuO_X$ top electrode 60 as shown in FIG. 6. On examining the $RuO_X$ top electrode using an optical microscope, it was found to have a width of $4.5 \times 10^{-5}$ $cm^2$ and a thickness of 150 nm.

The present specification compares three kinds of samples. The first sample is one annealed in a diffusion furnace, the second sample is annealed in the RTA apparatus and the third sample is one manufactured by the conventional method. The hysteresis loops and the durability properties and the leakage current of the first and second sample according to the present invention were measured by using the standard RT 66A, RT 6000HVS (by Radient) and the HP 8116A pulse generator (by Hewlett Packard).

The results of examining the hysteresis loops of the two $RuO_X$/PZT/$RuO_X$ capacitors according to the present invention show that the second sample heat-treated in the RTA apparatus has a better remanent polarization value than the first sample, heat-treated in the diffusion furnace. On examination of the leakage current, the first and second sample of the present invention indicate similar leakage current values of less than $10^{-6}$ $A/cm^2$ which is equivalent to less than 10% of the leakage current value of the third sample according to the conventional method. The leakage current value of the first and second sample is almost the same as the value of the Pt/PZT/Pt capacitor which uses platinum as an electrode material. As the result of examining resistance to fatigue properties of the first and second capacitor according to the present invention by using a 1 MHz 5V square wave pulse, the remanent polarization value is decreased by only about 10% over the course of $10^{12}$ switching cycles, and the leakage current value is only slightly changed. Since the uniformity of the PZT's surface is good, etching and the formation of a multilayered film which is required for manufacturing a RAM are possible.

EXAMPLE I

By spinning the spin coater at 4000 rpm, 0.1M of the PZT solution is coated onto the $RuO_X$ layer provided on the substrate, and then the coated layer is baked for five minutes at a temperature of 250° C. The above sample is annealed using the RTA apparatus to obtain a seed layer with a thickness of about 30 nm. The conditions for the heat treatment include an oxygen flow rate of 2 l/min, a ramping speed of 60° C./sec, a heating temperature of 750° C. and a heating time of 30 seconds.

After completing the formation of the seed layer, by spinning the spin coater at 2000 rpm, 0.4M of the PZT solution is coated onto the seed layer, which is then baked at a temperature of 250° C. The spin coating process and the baking process are repeated three times to obtain a PZT film with the desired thickness. Thereafter, a heat treatment process is performed using the RTA apparatus to produce the perovskite structure of the PZT film having a thickness of 300 nm. Conditions for the above heat treatment include an oxygen flow rate of 2 l/min, a ramping speed of 60° C./sec, a heating temperature of 750° C. and a heating time of 30 seconds. The surface of the obtained PZT film has excellent uniformity with no rosette structures. After the completion of the heat treatment, the $RuO_X$ top electrode is formed on the PZT film by the sputtering method. The electrical properties data indicate that the remanent polarization value is 20 $\mu C/cm^2$, and the decrease of the remanent polarization value over $10^{12}$ cycles is as little as 10%. Also, the leakage current value is $5 \times 10^{-7}$ A/cm$^2$ initially, and is $1.0 \times 10^{-6}$ A/cm$^2$ after the $10^{12}$ cycles.

EXAMPLE II

According to the conventional method, 0.4M of PZT solution is spin-coated onto the RuO$_X$ layer at 2000 rpm, and is then baked at a temperature of 250° C. The above steps for coating and baking are repeated three times. Thereafter, the heat treatment process is performed in a diffusion furnace to produce the perovskite structure of the PZT film having a thickness of 300 nm. The conditions for the heat treatment include an oxygen flow rate of 2 l/min, a heating temperature of 650° C. and a heating time of 30 minutes.

On examination of the PZT film according to the conventional method, the surface of the PZT film is found to be covered with the rosette patterns with diameters of 0.5~1 $\mu m$. The RuO$_X$ top electrode is formed on the PZT film. The results of measuring, the electrical properties show a remanent polarization value of 20 $\mu C/cm^2$, however the leakage current level is as high as $5 \times 10^{-5}$ A/cm$^2$ initially, and is increased to $5 \times 10^{-4}$ A/cm$^2$ after the $10^9$ cycles.

When comparing the results of Example I with those of Example II, the capacitor with a seed layer of the present invention shows considerably lower leakage current than the conventional capacitor without a seed layer. Its current leakage level is similar to that of Pt/PZT/Pt capacitor. Referring to the fatigue properties, the PZT film with a seed layer of the present invention shows much better endurance against repeated fatigue cycles. Also, the PZT film of the present invention has an excellent uniformity when compare to the conventional PZT film since it does not include any rosette structures.

What is claimed is:

1. A method for manufacturing a ferroelectric capacitor comprising the steps of:
   (a) coating a sol-gel solution of a first ferroelectric material of PZT on a first conductive oxide layer to form a first ferroelectric layer;
   (b) baking said first ferroelectric layer;
   (c) annealing said first ferroelectric layer to form a PZT seed layer with a perovskite structure;
   (d) coating a sol-gel solution of a second ferroelectric material on said seed layer to form a second ferroelectric layer;
   (e) baking said second ferroelectric layer; and
   (f) annealing said second ferroelectric layer to form a ferroelectric film with a perovskite structure.

2. A method for manufacturing a ferroelectric capacitor as claimed in claim 1, wherein said first conductive oxide layer is formed of at least one conductive oxide selected from the group consisting of IrO$_X$, RhO$_X$, RuO$_X$ and TiO$_X$.

3. A method for manufacturing a ferroelectric capacitor as claimed in claim 1, wherein said first conductive oxide layer is provided on a silicon substrate.

4. A method for manufacturing a ferroelectric capacitor as claimed in claim 1, wherein said first oxide layer is provided on a silicon oxide substrate.

5. A method for manufacturing a ferroelectric capacitor as claimed in claim 1, further comprising a step for forming a second conductive oxide layer on said ferroelectric film.

6. A method for manufacturing a ferroelectric capacitor as claimed in claim 5, wherein the second conductive oxide layer is formed of at least one conductive oxide selected from the group consisting of IrO$_X$, RhO$_X$, RuO$_X$ and TiO$_X$.

7. A method for manufacturing a ferroelectric capacitor as claimed in claim 1, wherein said ferroelectric film is PZT film.

8. A method for manufacturing a ferroelectric capacitor as claimed in claim 1, wherein the thickness of said seed layer is 5 to 70 nm.

9. A method for manufacturing a ferroelectric capacitor as claimed in claim 1, wherein said steps (d) and (e) are repeated several times.

10. A method for manufacturing a ferroelectric capacitor as claimed in claim 1, wherein at least one of said steps (c) and (f) is carried out under a rapid thermal annealing (RTA) process.

11. A method for manufacturing a ferroelectric capacitor as claimed in claim 10, wherein, in said RTA process, a ramping speed is 10 to 200° C./sec.

12. A method for manufacturing a ferroelectric capacitor as claimed in claim 10, wherein, in said RTA process, a heating temperature is 650 to 850° C. and a duration time for heating ranges from 20 to 200 seconds.

13. A method for manufacturing a ferroelectric capacitor as claimed in claim 1, wherein at least one of said steps (c) and (f) is performed under conditions including a ramping speed ranging from 10 to 200° C./min., a heating temperature ranging from 650 to 850° C. and a duration time for heating ranging from 20 to 200 seconds.

14. A method for manufacturing a ferroelectric capacitor comprising the steps of:
   (a) coating a sol-gel solution of a first ferroelectric material of PZT on a RuO$_X$ layer to form a first ferroelectric layer;
   (b) baking said first ferroelectric layer;
   (c) annealing said first ferroelectric layer to form a PZT seed layer with a perovskite structure;
   (d) coating a sol-gel solution of a second ferroelectric material on said seed layer to form a second ferroelectric layer;
   (e) baking said second ferroelectric layer; and
   (f) annealing said second ferroelectric layer to form a ferroelectric film with a perovskite structure.

15. A method for manufacturing a ferroelectric capacitor comprising the steps of:
   (a) coating a first PZT sol-gel solution on a first conductive oxide layer to form a first ferroelectric layer;
   (b) baking said first ferroelectric layer;
   (c) annealing said first ferroelectric layer to form a PZT seed layer;
   (d) coating a second PZT sol-gel solution on said PZT seed layer to form a second ferroelectric layer;
   (e) baking said second ferroelectric layer; and
   (f) annealing said second ferroelectric layer to form a PZT film.

16. A method for manufacturing a ferroelectric capacitor as claimed in claim 15, wherein a dopant is added to at least one of said first and said second PZT sol-gel solutions.

17. A method for manufacturing a ferroelectric capacitor as claimed in claim 16, wherein said dopant is at least one selected from the group consisting of Nb, Ta and La.

18. A method for manufacturing a ferroelectric capacitor as claimed in claim 17, wherein a concentration of said dopant is 0.5 to 7 mol %.

19. A method for manufacturing a ferroelectric capacitor comprising the steps of:

(a) coating a first PZT sol-gel solution on a $RuO_X$ layer to form a first ferroelectric layer;
(b) baking said first ferroelectric layer;
(c) annealing said first ferroelectric layer to form a PZT seed layer;
(d) coating a second PZT sol-gel solution on said PZT seed layer to form a second ferroelectric layer;
(e) baking said second ferroelectric layer; and
(f) annealing said second ferroelectric layer to form a PZT film with a perovskite structure.

20. A method for manufacturing a ferroelectric capacitor as claimed in claim 19, wherein a dopant is added to at least one of said first and said second PZT sol-gel solutions.

21. A method for manufacturing a ferroelectric capacitor as claimed in claim 20, wherein said dopant is at least one selected from the group consisting of Nb, Ta and La.

22. A method for manufacturing a ferroelectric capacitor as claimed in claim 21, wherein a concentration of said dopant is 0.5 to 7 mol %.

23. A method for manufacturing a ferroelectric capacitor as claimed in claim 21, wherein said seed layer functions as a diffusion barrier preventing for Ru component of said RuOx layer and Pb component of said PZT film to diffuse respectively into said PZT film and RuOx layer.

24. A method for manufacturing a ferroelectric capacitor as claimed in claim 21, wherein said seed layer functions as a perovskite phase-inducing layer to said PZT film.

25. A method for manufacturing a ferroelectric capacitor comprising the steps of:
(a) providing a $RuO_X$ layer on a substrate;
(b) form a PZT seed layer with a thickness of 5 to 70 nm on said $RuO_X$ layer;
(c) form a ferroelectric layer formed of one selected from $PbZrTiO_X$, $Pb(NbZr)TiO_X$, $Pb(TaZr)TiO_X$ and $Pb(LaZr)TiO_X$ on said PZT seed layer.

* * * * *

UNITED STATES PATENT AND TRADEMARK OFFICE
CERTIFICATE OF CORRECTION

PATENT NO. : 5,913,117
DATED : June 15, 1999
INVENTOR(S) : Wan-in Lee

It is certified that error appears in the above-identified patent and that said Letters Patent is hereby corrected as shown below:

Column 1, line 24, "last" should be -- lost --.

Signed and Sealed this

Twenty-fifth Day of January, 2000

Attest:

Attesting Officer

Acting Commissioner of Patents and Trademarks